United States Patent
Bélanger et al.

(10) Patent No.: US 7,332,424 B2
(45) Date of Patent: Feb. 19, 2008

(54) FLUXLESS SOLDER TRANSFER AND REFLOW PROCESS

(75) Inventors: Luc Bélanger, Canton de Granby (CA); Peter A. Gruber, Mohegan Lake, NY (US); Valérie Oberson, Québec (CA); Christopher L. Tessler, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 236 days.

(21) Appl. No.: 11/048,578

(22) Filed: Feb. 1, 2005

(65) Prior Publication Data

US 2006/0035454 A1 Feb. 16, 2006

Related U.S. Application Data

(60) Provisional application No. 60/602,075, filed on Aug. 16, 2004.

(51) Int. Cl.
*H01L 21/44* (2006.01)

(52) U.S. Cl. .............................. 438/616; 257/E21.508; 257/E21.509; 257/E21.511

(58) Field of Classification Search ................. 438/616
See application file for complete search history.

(56) References Cited

U.S. PATENT DOCUMENTS

| | | | |
|---|---|---|---|
| 5,244,143 A * | 9/1993 | Ference et al. ......... 228/180.21 |
| 5,499,754 A * | 3/1996 | Bobbio et al. ................. 228/42 |
| 5,604,831 A | 2/1997 | Dittman et al. |
| 5,742,025 A | 4/1998 | Dittman et al. |
| 5,763,854 A | 6/1998 | Dittman et al. |
| 5,775,569 A * | 7/1998 | Berger et al. ................ 228/254 |
| 5,829,668 A * | 11/1998 | George et al. ............... 228/254 |
| 5,852,257 A | 12/1998 | Dittman et al. |
| 5,865,365 A * | 2/1999 | Nishikawa et al. ......... 228/223 |
| 5,992,729 A * | 11/1999 | Koopman et al. ........... 228/175 |
| 6,025,258 A * | 2/2000 | Ochiai et al. ................ 438/613 |
| 6,136,047 A * | 10/2000 | Karasawa et al. .......... 29/25.01 |
| 6,149,122 A * | 11/2000 | Berger et al. ................ 249/119 |
| 6,271,111 B1 * | 8/2001 | Farooq et al. ............... 438/614 |
| 6,319,810 B1 * | 11/2001 | Ochiai et al. ................ 438/616 |
| 6,332,569 B1 * | 12/2001 | Cordes et al. ............... 228/254 |
| 6,335,271 B1 * | 1/2002 | Fukuyama ................... 438/616 |
| 6,471,115 B1 * | 10/2002 | Ijuin et al. .............. 228/180.22 |
| 6,527,158 B1 | 3/2003 | Brouillette et al. |
| 6,723,629 B2 * | 4/2004 | Hotchkiss et al. ........... 438/612 |
| 6,936,532 B2 * | 8/2005 | Sakaida ....................... 438/616 |
| 7,078,821 B2 * | 7/2006 | Matsunami ................. 257/780 |
| 2002/0173136 A1* | 11/2002 | Tsukui et al. ................ 438/613 |
| 2003/0013228 A1* | 1/2003 | Hotchkiss et al. ........... 438/106 |
| 2005/0035453 A1* | 2/2005 | Ho et al. ..................... 257/739 |

\* cited by examiner

*Primary Examiner*—David A. Zarneke
(74) *Attorney, Agent, or Firm*—Ference & Associates LLC

(57) ABSTRACT

Disclosed is a new process that permits the transfer and reflow of solder features produced by Injection Molded Solder (IMS) from a mold plate to a solder receiving substrate without the use of flux. Several embodiments produce solder transfer and reflow separately or together and use either formic acid vapor or partial concentration of hydrogen, both in nitrogen, as the oxide reducing atmosphere. A final embodiment produces fluxless transfer and reflow in only nitrogen through the use of ultrasonic vibration between the solder filled mold plate and solder receiving substrate.

10 Claims, 6 Drawing Sheets

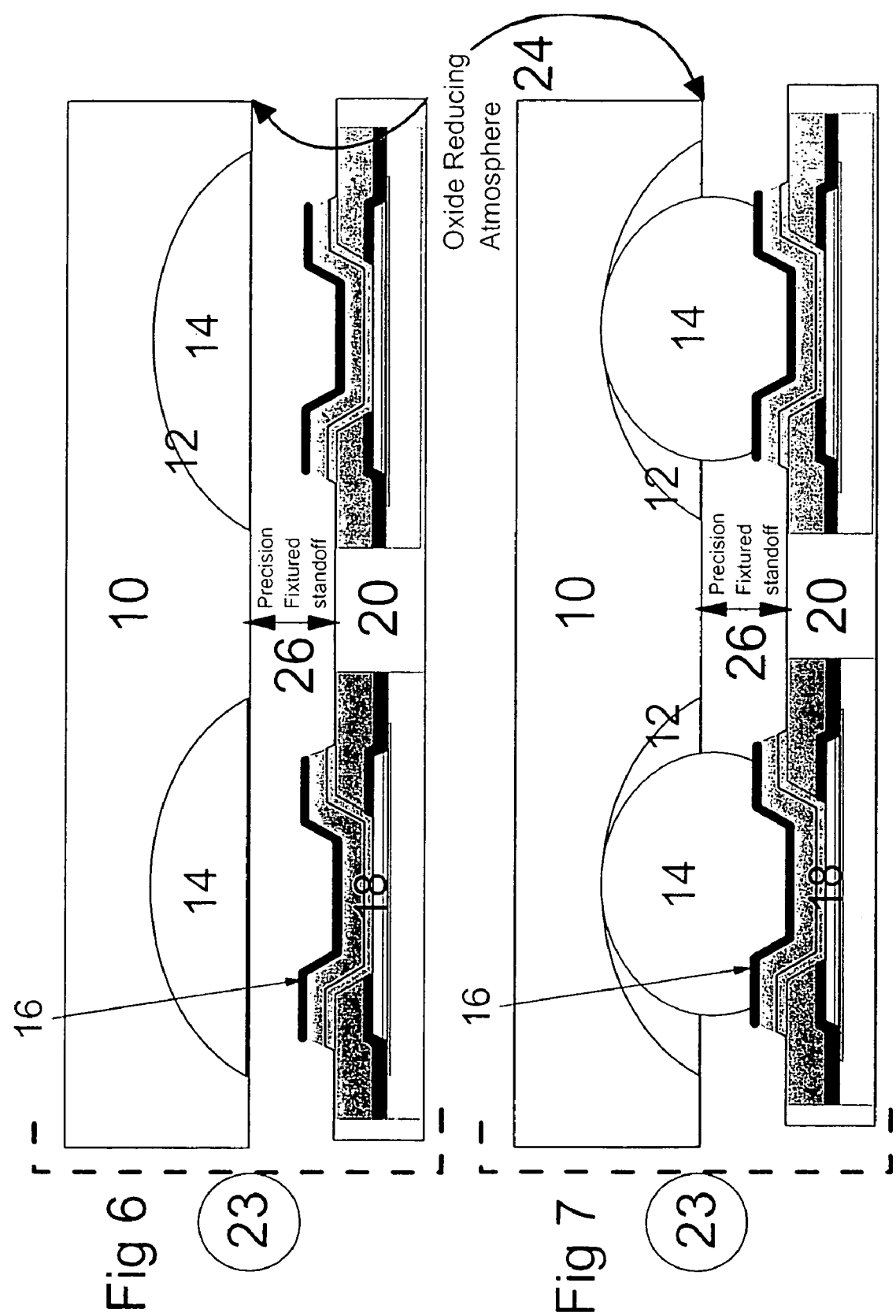

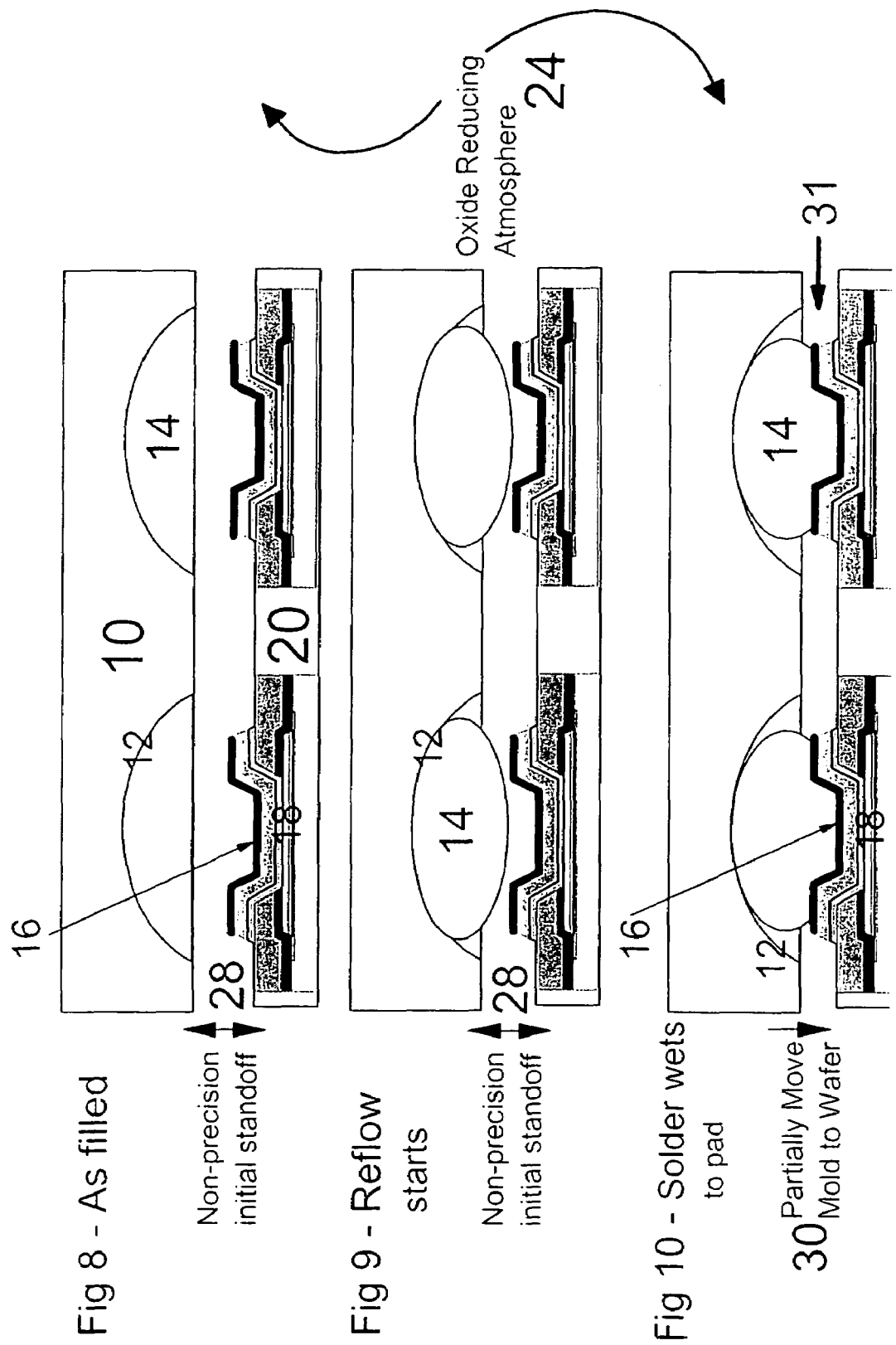

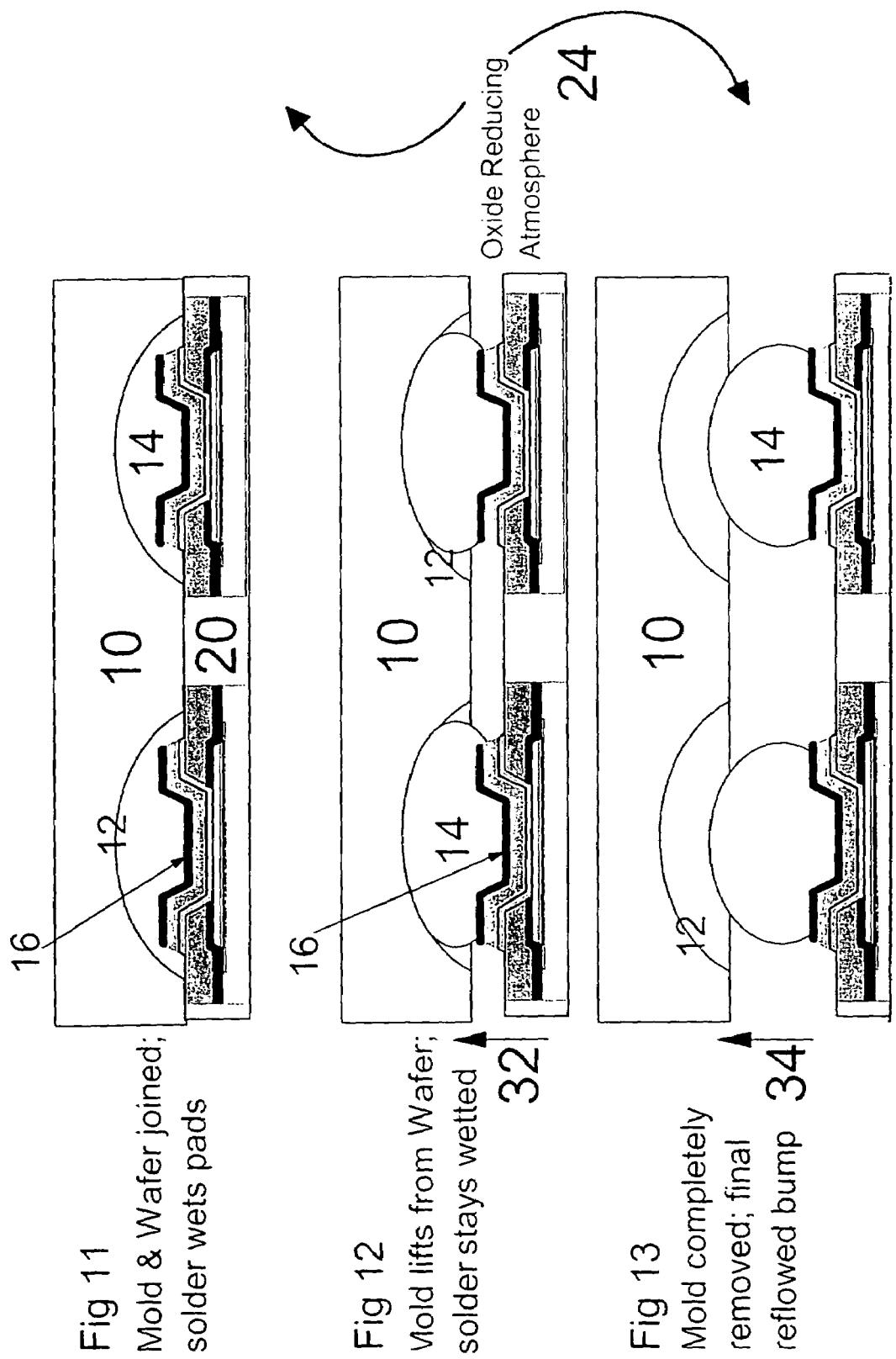

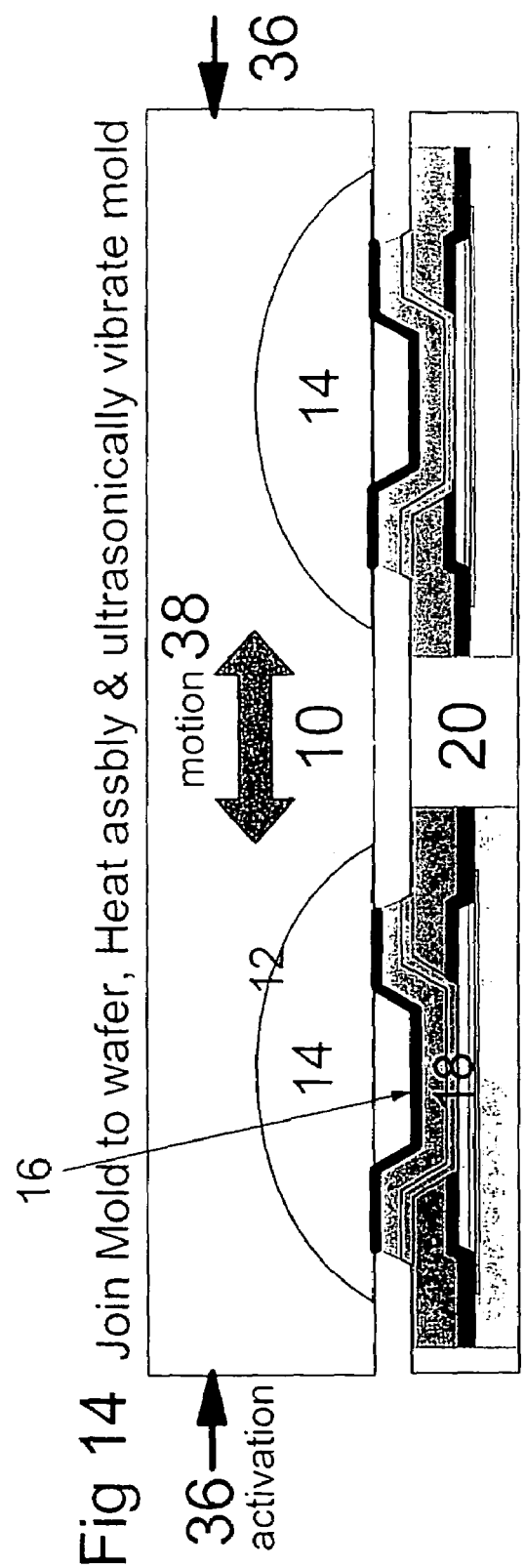
Fig 14 Join Mold to wafer, Heat assbly & ultrasonically vibrate mold
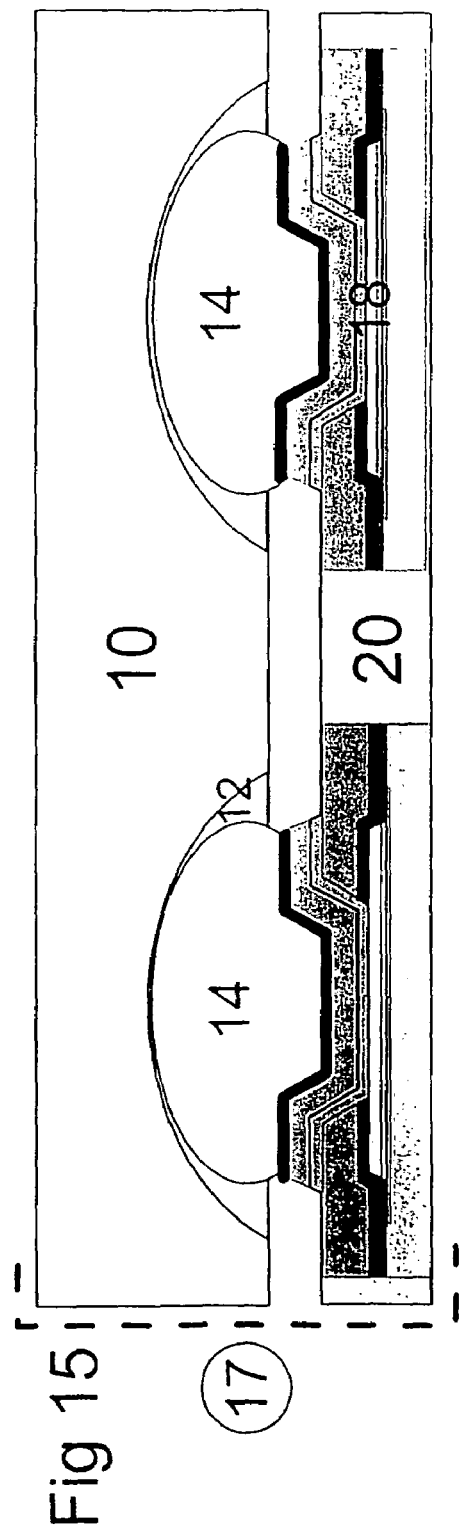
Fig 15

FLUXLESS SOLDER TRANSFER AND REFLOW PROCESS

CLAIM OF PRIORITY

This application claims priority from U.S. Provisional Patent Application No. 60/602,075, filed on Aug. 16, 2004, which is hereby incorporated by reference as if fully set forth herein.

FIELD OF THE INVENTION

The present invention relates to the field of solder interconnects formed between silicon circuit devices and substrates forming the next layer of electrical interconnect and, more particularly, to improvements on Injection Molded Solder (IMS) technologies used to form solder bump interconnections on silicon wafers to eliminate the use of flux.

BACKGROUND OF THE INVENTION

Injection Molded Soldering (IMS) is a process with many applications, primarily suited for low-cost solder bumping of semiconductor wafers. The process basically involves scanning a head which dispenses molten solder through a linear slot over a mold plate to fill cavities therein with molten solder. After the scan, the solder in the cavities is solidified and then the mold plate is aligned to and placed in contact with a wafer by an appropriate fixture. This assembly is then heated to reflow and transfer the solder from the mold plate cavities to metallized pads on the wafer. After cooling and separating the wafer and mold plate, the wafer is bumped with solder preforms typically used for flip chip applications.

Solder transfer from mold plate to wafer in IMS wafer bumping is routinely practiced using flux as the activating agent. Using flux, however, is not ideal for every application and there may be a number of problems associated with the use of flux. First, there are some applications such as those cited in references [U.S. Pat. No. 5,604,831] and [U.S. Pat. No. 5,852,257] that cannot tolerate the use of flux. These include optical applications that would suffer damaging contamination to sensitive optical components if flux were included in any process steps. Secondly, extra processing steps are required to apply flux for solder transfer and reflow as well as cleaning flux from both wafers and mold plates after processing. These steps increase cost and complexity for IMS wafer bumping, and may shorten mold life due to extra processing steps. Third, if the flux application is accomplished by a wiping over the filled mold plate, there is the chance that some of the filled cavities might lose their solder volumes. This is due to the surface tension of the liquid flux causing a "suctioning effect" over the cavities as it is applied. Thus bumping yield could be reduced. Fourth, using flux creates the possibility of residual contamination left behind after cleaning. Some of these chemical residues may adversely affect long-term reliability of the entire solder interconnect structure.

There thus exists a need to eliminate the use of flux for solder transfer and reflow processing done with IMS.

SUMMARY OF THE INVENTION

Although solder features used in flip chip interconnect are much smaller than the macroscopic solder joints used for many electronic applications, they still require the formation of a metallurgical joint between the solder and the metal layers which form the electrical interconnect. Solder alloys of various metallic components such as lead, tin, bismuth, copper, silver and indium always form an oxide layer on the surface in a standard atmospheric environment. The present invention is broadly directed to removal of the oxide layer without the use of flux.

In summary, one aspect of the invention provides a process for transfer of molten solder from cavities in a mold plate to wettable pads on a substrate without the use of flux, the process comprising the steps of: aligning the mold plate with the substrate, whereby the solder in the cavities is in contact with the wettable pads of the substrate; placing the mold plate and the substrate into an oxide reducing atmosphere; heating the substrate above the melting temperature of the solder, whereby an oxide which may have formed on the wettable pads is removed thereby permitting wetting of the solder to the wettable pads; cooling the substrate to solidify solder and thereafter removing the mold plate from the substrate while leaving behind the solder on the wettable pads; reheating said substrate in said oxide reducing atmosphere whereby the solder may reflow into a spherical shape; and cooling the substrate to solidify the solder in the spherical shape.

Another aspect of the present invention provides a process for transferring molten solder from cavities in a mold plate to wettable pads on a substrate, the process comprising the steps of: aligning the mold plate to the substrate so that said solder in the cavities is in abutting contact with the wettable pads; placing the mold plate and substrate in a nitrogen atmosphere, wherein said mold plate is attached to an actuator capable of providing lateral motion at ultrasonic frequencies and vertical Z motion; heating the mold plate and substrate above the melting temperature of the solder; abrasively removing an oxide which may have formed through vibrational contact with the wettable pads thereby permitting wetting of the solder to the wettable pads; moving the mold plate away from the substrate through the Z actuator allowing solder to reflow and spheridize; and cooling the substrate to solidify the solder in the spherical shape.

For a better understanding of the present invention, together with other and further features and advantages thereof, reference is made to the following description, taken in conjunction with the accompanying drawings, and the scope of the invention will be pointed out in the appended claims.

BRIEF DESCRIPTION OF THE DRAWINGS

FIG. 6 shows an alternative embodiment to the abutting contact of FIG. 2. Here the mold plate and wafer are held in an aligned state with a precision fixed standoff between their faces to permit better penetration of a solder oxide reducing atmosphere before the heating step to produce transfer and reflow.

FIG. 7 shows this second embodiment after the heating step to produce transfer and reflow.

FIGS. 8-10 show a third embodiment in a solder oxide reducing atmosphere which allows a non-precise initial standoff followed by precision vertical motion of the mold plate towards the wafer allowing the reflowed molten solder volumes to wet the UBM's.

FIGS. 11-13 show a fourth embodiment in a solder oxide reducing atmosphere wherein the mold plate and wafer are aligned and initially either abutting or in close vertical proximity to allow transfer of the solder, followed by precision vertical motion of the mold plate away from the wafer until the solder volumes completely detach from the cavities of the mold plate, thus eliminating the need for an additional reflow step.

FIGS. 14 & 15 show a fifth embodiment in a standard nitrogen environment wherein the oxide reducing property is produced by ultrasonic motion of the mold plate in contact with the wafer to produce wetting to the UBM and transfer of the solder.

DESCRIPTION OF THE PREFERRED EMBODIMENTS

IMS wafer bumping requires the transfer of solder volumes from cavities in mold plates that are matched in the coefficient of thermal expansion to silicon or whatever the substrate requiring the solder bumps. A new fluxless solder transfer and reflow process is here described in detail to accomplish the above. FIGS. 1-13 should be understood as using either a formic acid or hydrogen atmosphere to produce the removal of solder oxides. The specific solder alloy determines which atmosphere to use. For example, when using alloys containing a high percentage of lead, such as 97% Pb 3% Sn, reflow temperatures of more than 320 C are typically used. At such elevated temperatures, hydrogen reflow works well with hydrogen being more active in eliminating oxides at temperatures above 300 C.

For some time, SnPb eutectic has been used in many solder interconnect applications. This alloy has a lower melting temperature of 183 C and thus cannot effectively use hydrogen reflow as a fluxless process. Also, most of solder interconnects used for flip chip packaging are moving away from lead towards complete lead-free interconnects. These typically center on the use of tin as the main component and have melting temperature closer to PbSn eutectic, namely between 200 and 240 C. For all of these solder alloys hydrogen reflow is not effective, whereas formic acid vapor in a nitrogen environment will effectively remove oxides from these lower melting temperature alloys. Thus, in FIGS. 1-13, all fluxless activation will be described with the understanding that formic acid vapor in nitrogen is used for lower temperature alloys and hydrogen gas at limited concentrations for alloys with melting points above 300 C as the oxide reducing atmospheres.

Figure 1:
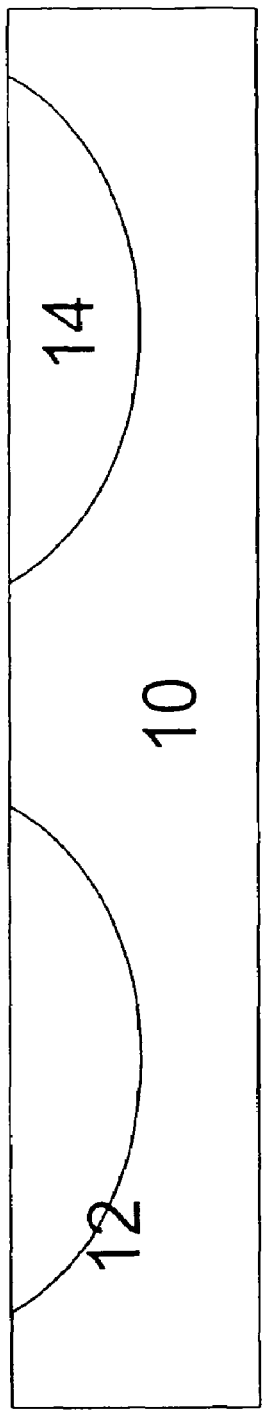
FIG. 1 shows the basic solder filled mold plate used in IMS wafer bumping. The cavities are filled with solder as described in reference 5 above.

FIG. 1 shows a basic IMS mold plate 10 showing solder containing cavities 12 which were filled with solder 14 using the IMS process as described in reference [U.S. Pat. No. 6,527,158]. Mold plate 10 is usually made of a material whose coefficient of thermal expansion (CTE) is matched to the substrate that will receive the solder volumes, usually silicon.

Figure 2:
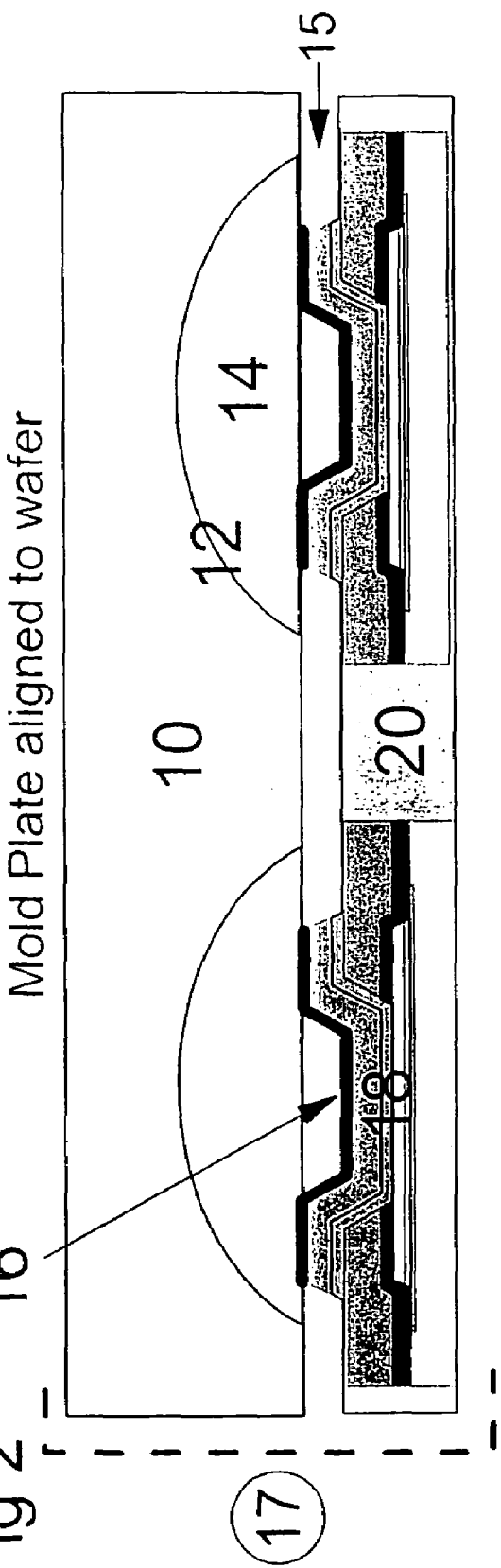
FIG. 2 shows the solder filled mold plate flipped and aligned to a silicon wafer requiring solder bumping. This is the basic fixtured assembly that is subjected to heating and oxide removing processes to transfer the solder from the mold plate cavities to the UBM (under bump metallurgy) on the wafer.

As shown in FIG. 2, during the excursion from room temperature to above the solder melting temperature, the solder 14 in the mold plate cavities 12 remains aligned to the under bump metallurgy (UBM) 16 of solder receiving location 18 on the silicon wafer 20. Also, slight gap 15 produced simply by the three dimensional topography of the UBM metallization allows the penetration of the oxide reducing atmosphere 24 to the solder/UBM interface where removal of the solder oxide will take place. This will allow wetting of the solder 14 to the UBM 16 once the joined mold plate/wafer assembly is above the solder melting temperature.

Figure 3:
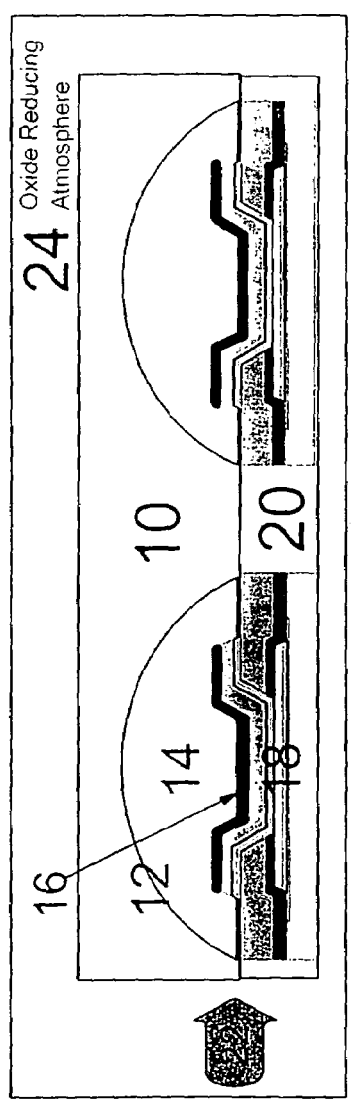
FIG. 3 shows the wafer and mold plate after the solder has transferred to the UBM in the oxide reducing atmosphere.

This wetting is shown in FIG. 3 which shows solder 14 in cavities 12 of mold plate 10 completely encasing UBM 16 of solder receiving location 18. This has happened after the assembly 22 has been raised approx. 10-20° C. above the solder melting temperature under the oxide reducing atmosphere 24. After the wetting of the molten solder 14 to the UBM 16, the assembly 22 is allowed to cool so that the solder re-solidifies.

Figure 4:
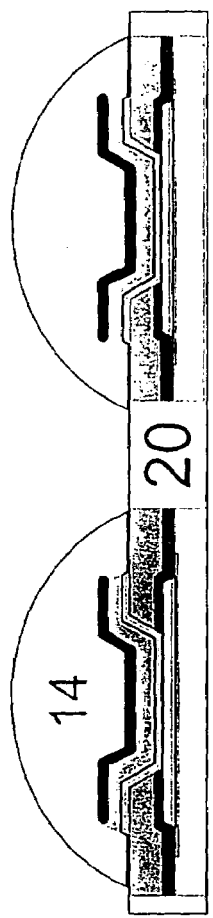
FIG. 4 shows the wafer with the unreflowed solder volumes and with the mold plate removed.

As shown in FIG. 4, the mold plate 10 is thereafter removed from the wafer 20 revealing the solder volumes 14 metallurgically bonded to the solder receiving locations 18 by means of the UBM 16. These solder volumes 14 have the same shape as the cavities 12 in the mold plate 10 since they resolidify while constrained by the cavity shape. However, since solder cavities 12 have an internal surface that is non-wetting to solder, they readily release the solder in either a molten or solidified state when the solder, which now metallurgically bonded to the UBM, is pulled away from the mold plate as the wafer and mold plate are separated.

Figure 5:
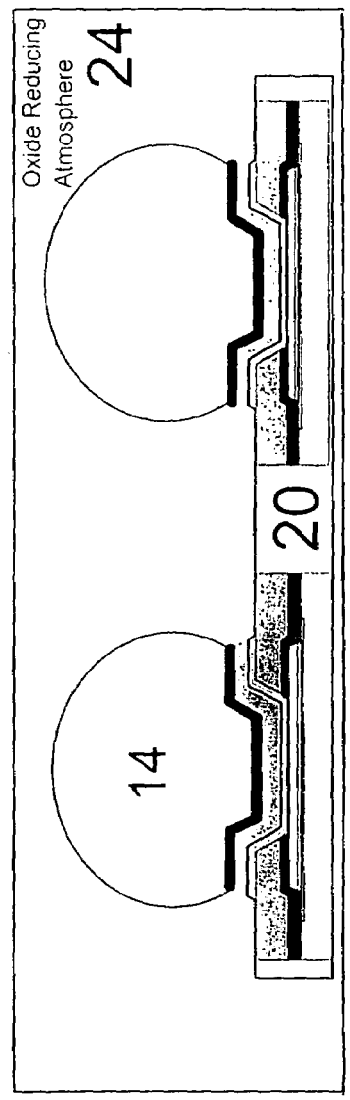
FIG. 5 shows the solder bumps after another heating step in an oxide reducing atmosphere which has allowed surface tension of the solder to change the shape from a flattened hemisphere to a spherical bump. This is the final shape desired for flip chip interconnect.

FIG. 5 shows the change in shape of the solder 14 from hemispherical to a spherical bump after a reflow step in an oxide reducing atmosphere 24. This is the end shape desired in solder bumping for flip chip interconnects.

FIGS. 6 & 7 show a second embodiment that produces fluxless solder transfer and reflow. Here a precisely defined standoff between the mold plate and the wafer aligned UBM's to solder volumes permits better penetration of the oxide reducing atmosphere, either formic acid or hydrogen. In this embodiment, the mold plate and wafer remain in fixed positions throughout the entire cycle, and only the activated solder moves towards the wafer.

As shown in FIG. 6, fixturing 26 produces a precisely defined standoff between the solder filled mold plate 10 and the solder receiving wafer 20. This precision fixtured standoff 26 is greater than that produced in the first embodiment of FIGS. 1-5, thus allowing a shorter time for the oxide reducing atmosphere 24 to remove solder oxides from the solder 14 in cavities 12 of FIG. 6. This precisely fixtured assembly 23 is heated in the presence of the oxide reducing atmosphere 24 until the solder volumes 14 in mold plate cavities 12 are above the solder melting temperature.

FIG. 7 shows that once the solder 14 is heated above its melting temperature it will "ball up" towards the UBM 16 of the solder receiving location 18, while at the same time retracting from the cavity walls of solder cavity 12. Since the precision fixtured standoff 26 is less than the "ball up" height of the reflowed solder 14, typically about 25-35 microns, the solder actually contacts UBM 16 and instantly forms a metallurgical bond. At this point the assembly 23 is cooled and the mold plate 10 is removed from the wafer 20. Depending on application, the solder volumes 14 on the wafer 20 may or may not need another reflow to fully spheridize them from the partial spheres permitted by the precision fixtured standoff 26.

FIGS. 8-10 shows a third embodiment to produce fluxless solder transfer and reflow. In this case there is an even larger initial standoff that is produced by putting the mold plate onto a precision Z actuator and initially distancing the mold plate substantially from the wafer (>200 microns) to allow good access of the oxide reducing atmosphere to the solder. In this embodiment, there is a small motion of the solder from the cavities once activated and a large motion of the mold plate towards the wafer to produce transfer.

As shown in FIG. 8, mold plate 10 is initially attached to a precision Z actuator that vertically positions the mold plate 10 at a non-precise distance 28 from the wafer 20 while at the same time keeping a precise alignment of the solder 14 in the cavities 12 and the UBM 16 of solder receiving locations 18. Both wafer 20 and mold plate 10 are placed in an oxide reducing atmosphere 24 which will heat both mold plate and wafer.

FIG. 9 shows the slight motion of solder 14 in cavities 12 out of the cavities as the restraining effect of the oxide is removed and surface tension begins "balling up" the solder.

As shown in FIG. 10, once all the solder in the cavities has "balled up", the Z actuator attached to mold plate 10 begins the precise movement 30 of the mold plate towards the wafer until the molten solder 14 of all the cavities 12 hit the UBM 16 of the solder receiving locations 18 on wafer 20 at which time mold plate Z motion stops at final mold plate to wafer gap distance 31.

Another advantage of this third embodiment is that the solder 14 initially contacts the center of UBM 16 as a partially spherical or crowned feature, thus assuring that solder wetting starts in the center and expands radially outward and thereby eliminates gas voids that could be trapped at the interface. At final mold plate to wafer gap distance 31, the joined mold plate and wafer assembly is cooled to solidify the solder 14. As in embodiment two above, depending on application, the solder volumes 14 on the wafer 20 may or may not need another reflow to fully spheridize them from the partial spheres produced by the final gap distance 31.

A fourth embodiment is shown in FIGS. 11-13. Here there is no final reflow required since the mold plate is completely removed from the wafer after the molten solder has transferred.

As seen in FIG. 11, wetting of the solder 14 to the UBM 16 may be accomplished using either an abutting assembly of mold plate 10 to wafer 20 described in embodiment one in an oxide reducing atmosphere, or by a precise or non-precise standoff between mold plate 10 and wafer 20 as in embodiments two and three, which are not shown.

FIG. 12 shows mold plate 10 attached to a precise Z actuator that begins to separate it from the wafer while the solder 14 is above the melting temperature. Since wetting of solder 14 to UBM 16 has already taken place, the solder volumes begin to spheridize at the initial separation distance 32 of the mold plate from wafer.

FIG. 13 shows how the mold plate continues to move away from the wafer while the assembly is still heated until there is a complete separation of the solder 14 from the cavity 12 at final separation distance 34. At this point, the assembly is cooled allowing the solder 14 to solidify on the UBM 16 while completely unconstrained by the mold plate 10.

Thus, in this embodiment, there is no additional reflow step required, since the solder 14 has completely shperidized before solidifying after the initial transfer step. However, due to desirability of the flatter shape of transferred solder in embodiments 1-3 for probing and testing, this embodiment is not always desirable, despite eliminating one process step.

FIGS. 14 and 15 describe a fifth embodiment that is novel in that it does not require either formic acid or hydrogen to eliminate the solder oxides, but rather uses ultrasonic vibration in nitrogen to accomplish this.

As FIG. 14 shows, mold plate 10 is in abutting contact with wafer 20 at the UBM 16 to solder 14 interface. This assembly 17 is heated above the solder melting temperature, after which an ultrasonic activation 36 of the mold plate 10 induces a lateral vibrational motion 38. This vibration causes an abrasion of the solder oxide "skin" on the now molten solder 14 in mold plate cavities 12 rubbing against the UBM 16 of the solder receiving locations 18 on stationary wafer 20. After a short time, this abrasive effect breaks down the oxide, allowing unoxidized molten solder to contact the UBM metallization 16 and thus instantly wet and bond to same. In this application, the UBM 16 must have gold as the top layer which remains unoxidized and wettable, whereas in previous embodiments the UBM 16 could be gold or even copper.

As seen in FIG. 15, once wetting takes place, the solder 14 changes in shape when, as previously in embodiment 4, the mold plate 10 is moved slightly away from the wafer 20. This Z motion of the mold plate 10 can either be completely away from the wafer, thus avoiding the need for another reflow, or partially away to allow the solder 14 to pull away from the cavity 12 side walls. This embodiment breaks the oxide skin of the molten solder much the way a thin eggshell is easily broken with mechanical abrasion thus releasing its liquid content. All of this may be accomplished in a simple nitrogen atmosphere.

A fluxless solder transfer and reflow process applied to IMS wafer bumping has been described. The oxide reducing atmosphere for embodiments 1-4 depend on the solder alloy used; either formic acid vapor of ~1% in nitrogen for solder alloys with a melting temperature below 280-300 C, or a partial hydrogen gas for solder alloys with a melting temperature above 280-300 C. For embodiment 5, a simple nitrogen atmosphere will suffice since the oxide breakdown is accomplished by an abrasion caused by the relative motion of a ultrasonically vibrating mold plate against a stationary wafer.

If not otherwise stated herein, it is to be assumed that all patents, patent applications, patent publications and other publications (including web-based publications) mentioned and cited herein are hereby fully incorporated by reference herein as if set forth in their entirety herein.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

REFERENCES

[1] U.S. Pat. No. 5,604,831: Optical module with fluxless laser reflow soldered joints—Feb. 18, 1997

[2] U.S. Pat. No. 5,742,025: Laser reflow soldering process with lead-tin solder pads—Apr. 21, 1998

[3] U.S. Pat. No. 5,763,854: Machine for laser reflow soldering—Jun. 9, 1998

[4] U.S. Pat. No. 5,852,257: Optical module with fluxless laser reflow soldered joints—Dec. 22, 1998

[5] U.S. Pat. No. 6,527,158: Method and Apparatus For Forming Solder Bumps—Mar. 4, 2003

What is claimed is:

1. A process for transfer of molten solder from cavities in a mold plate to wettable pads on a substrate without the use of flux, the process comprising the steps of:
   aligning the mold plate with the substrate, whereby the solder in the cavities is in contact with the wettable pads of the substrate;
   placing the mold plate and the substrate into an oxide reducing atmosphere;
   heating the substrate above the melting temperature of the solder, whereby an oxide which may have formed on the wettable pads is removed thereby permitting wetting of the solder to the wettable pads;
   cooling the substrate to solidify solder and thereafter removing the mold plate from the substrate while leaving behind the solder on the wettable pads;
   reheating said substrate in said oxide reducing atmosphere whereby the solder may reflow into a spherical shape; and
   cooling the substrate to solidify the solder in the spherical shape.

2. A process according to claim 1, wherein the solder is a solder alloy having a melting temperature below about 280-300° C. and the oxide reducing atmosphere comprises formic acid vapor.

3. A process according to claim 1, wherein the solder is a solder alloy having a melting temperature above about 280-300° C. and the oxide reducing atmosphere comprises a partial concentration of hydrogen gas in nitrogen.

4. A process according to claim 1, wherein the solder is a solder alloy having a melting temperature above about 280-300° C. and the oxide reducing atmosphere comprises substantially 100% hydrogen gas.

5. A process according to claim 1, wherein the mold plate and the substrate are aligned using a precision fixtured standoff which is bridged by reflowing the solder after the oxide has been removed and a metallurgical bond to the wettable pads on the substrate has occurred.

6. A process according to claim 5, wherein the precision fixtured standoff is between 20-30 microns.

7. A process according to claim 1, further comprising the steps of:
   attaching the mold plate to a precision Z actuator, wherein the mold plate is initially positioned to laterally align the wettable pads of the substrate to solder filled cavities of the mold plate and the mold plate is vertically separated from said substrate by a distance greater than 200 microns; and
   bringing the reflowed solder into contact with the wettable pads by moving the mold plate on the Z actuator towards the substrate whereby a metallurgical joint is produced and the solder is transferred from cavities of the mold plate to the wettable pads.

8. A process according to claim 7, wherein the reflowed solder in the mold plate cavities initially contacts center points of the wettable pads and thereafter expands radially outward on the wettable pads to exclude gas voids at an interface of the reflowed solder and the wettable pads.

9. A process according to claim 1, further comprising the steps of:
   attaching the mold plate to a precision Z actuator, wherein the mold plate is first aligned to the substrate so that solder in the cavities is in abutting contact with the wettable pads;
   heating the substrate in an oxide reducing atmosphere to produce wetting of the solder in the cavities to the wettable pads;
   moving the mold plate away from the substrate while keeping the substrate and the mold plate above the solder melting temperature so that the solder spheridizes while molten.

10. A process for transferring molten solder from cavities in a mold plate to wettable pads on a substrate, the process comprising the steps of:
    aligning the mold plate to the substrate so that said solder in the cavities is in abutting contact with the wettable pads;
    placing the mold plate and substrate in a nitrogen atmosphere, wherein said mold plate is attached to an actuator capable of providing lateral motion at ultrasonic frequencies and vertical Z motion;
    heating the mold plate and substrate above the melting temperature of the solder;
    abrasively removing an oxide which may have formed through vibrational contact with the wettable pads thereby permitting wetting of the solder to the wettable pads;
    cooling the substrate to solidify the solder and thereafter removing the mold plate from the substrate while leaving behind the solder on the wettable pads;
    reheating said substrate in said nitrogen atmosphere whereby the solder may reflow into a spherical shape;
    cooling the substrate to solidify the solder in the spherical shape.

* * * * *